United States Patent
Rhoden et al.

(10) Patent No.: US 10,225,950 B2
(45) Date of Patent: Mar. 5, 2019

(54) AIRCRAFT HEAT EXCHANGE SYSTEM INCLUDING A THERMOELECTRIC DEVICE

(71) Applicant: Hamilton Sundstrand Corporation, Charlotte, NC (US)

(72) Inventors: William E. Rhoden, Glastonbury, CT (US); Charles E. Lents, Amston, CT (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 670 days.

(21) Appl. No.: 14/808,523

(22) Filed: Jul. 24, 2015

(65) Prior Publication Data

US 2017/0027082 A1    Jan. 26, 2017

(51) Int. Cl.
| | |
|---|---|
| *F25B 21/00* | (2006.01) |
| *F25B 21/02* | (2006.01) |
| *F25B 21/04* | (2006.01) |
| *B64D 37/02* | (2006.01) |
| *B64D 37/34* | (2006.01) |
| *H05K 7/20* | (2006.01) |
| *H01L 35/30* | (2006.01) |

(52) U.S. Cl.
CPC ......... *H05K 7/20272* (2013.01); *B64D 37/02* (2013.01); *B64D 37/34* (2013.01); *H01L 35/30* (2013.01); *H05K 7/20281* (2013.01)

(58) Field of Classification Search
CPC .......... F25B 21/00; F25B 21/02; F25B 21/04; F25B 2321/02; F25B 2321/021; F25B 2321/025; H05K 7/2072; H05K 7/20281; B64D 37/02; B64D 37/34
See application file for complete search history.

(56) References Cited

U.S. PATENT DOCUMENTS

| | | | |
|---|---|---|---|
| 4,505,124 A | 3/1985 | Mayer | |
| 5,584,183 A | 12/1996 | Wright et al. | |
| 6,236,810 B1* | 5/2001 | Kadotani | F25B 21/02 392/483 |

(Continued)

FOREIGN PATENT DOCUMENTS

| | | |
|---|---|---|
| EP | 1902950 A1 | 3/2008 |
| EP | 2147860 A2 | 1/2010 |

(Continued)

OTHER PUBLICATIONS

European Search Report for Application No. 16180964.5-1754, dated Oct. 28, 2016, 7 Pages.

(Continued)

*Primary Examiner* — Frantz Jules
*Assistant Examiner* — Erik Mendoza-Wilkenfe
(74) *Attorney, Agent, or Firm* — Cantor Colburn LLP

(57) ABSTRACT

A heat exchange system for an aircraft includes an aircraft controller for controlling an operation of an aircraft, a thermoelectric device having a low temperature side and a high temperature side, an inlet line that carries fluid through the low temperature side of the thermoelectric device and to the aircraft controller; and an outlet line that carrier the fluid away from the and aircraft controller through the high temperature side of the thermoelectric device. Heat is transferred away from the inlet line to the outlet line through the thermoelectric device when a predetermined condition is met.

8 Claims, 2 Drawing Sheets

(56) References Cited

U.S. PATENT DOCUMENTS

| | | | |
|---|---|---|---|
| 7,779,811 B1 | 8/2010 | Mailander et al. | |
| 8,248,801 B2 * | 8/2012 | Campbell | H05K 7/2079 |
| | | | 165/104.33 |
| 8,424,285 B2 | 4/2013 | Veilleux, Jr. | |
| 2009/0000310 A1 | 1/2009 | Bell | |
| 2010/0011781 A1 | 1/2010 | Lents et al. | |
| 2010/0313591 A1 | 12/2010 | Lents et al. | |
| 2012/0047911 A1 * | 3/2012 | Bhavsar | F25B 21/02 |
| | | | 62/3.6 |
| 2012/0095661 A1 | 4/2012 | Roy et al. | |
| 2012/0095662 A1 | 4/2012 | Roy et al. | |
| 2012/0095663 A1 * | 4/2012 | Roy | F02C 9/263 |
| | | | 701/100 |
| 2012/0240593 A1 * | 9/2012 | MacFarlane | F02C 7/047 |
| | | | 60/779 |
| 2013/0152604 A1 * | 6/2013 | Mimata | H01L 21/67017 |
| | | | 62/3.3 |
| 2013/0327071 A1 * | 12/2013 | Doughty | G01M 3/3245 |
| | | | 62/114 |
| 2015/0233605 A1 | 8/2015 | Bernhardt | |
| 2017/0021938 A1 | 1/2017 | Lents et al. | |

FOREIGN PATENT DOCUMENTS

| | | |
|---|---|---|
| EP | 2273088 A1 | 1/2011 |
| EP | 2441938 A1 | 4/2012 |

OTHER PUBLICATIONS

European Search Report for Application No. 16204835.9-1754, dated May 15, 2017, 9 Pages.

\* cited by examiner

AIRCRAFT HEAT EXCHANGE SYSTEM INCLUDING A THERMOELECTRIC DEVICE

BACKGROUND OF THE INVENTION

The present disclosure relates to a heat exchanger for an aircraft and, in particular, to using a thermoelectric device to regulate the heat of fuel used to cool a controller of the aircraft.

An aircraft has a number of electronic controllers used to control an operation of the aircraft. One such controller manages the function of the aircraft engines and is commonly known as a Full Authority Digital Engine Control or FADEC. The FADEC is generally installed in an environment of the aircraft susceptible to both very high temperatures and very low temperatures. For example, the FADEC may be installed in the engine bay where large amounts of heat are generated during flight conditions. In these conditions, the FADEC requires a substantial amount of cooling to regulate its operating temperature. When the aircraft is not in flight, however, the engine bay may be extremely cold when ambient air temperature is low. At these conditions, the FADEC requires very little, if any, cooling.

The FADEC, like many aircraft controls, is composed of electronic components that require moderate and uniform temperatures for optimal operation. The large temperature swings experienced by the FADEC is not conducive to the best performance of these temperature sensitive components. While there are electronic components that are capable of performing at the extreme temperature conditions of the aircraft, these components are generally very expensive and have relatively low performance (memory, process, reliability, or speed) compared to most modern electronics.

A need therefore exists for an assembly and technique that maintains the electronics of an aircraft controller within their designed operating temperatures.

SUMMARY OF THE INVENTION

According to one embodiment, a heat exchange system for an aircraft control is disclosed. The system includes an aircraft controller for controlling an operation of an aircraft, a thermoelectric device having a low temperature side and a high temperature side, an inlet line that carries fluid through the low temperature side of the thermoelectric device and to the aircraft controller and an outlet line that carries the fluid away from the and aircraft controller through the high temperature side of the thermoelectric device. In this embodiment, heat is transferred away from the inlet line to the outlet line through the thermoelectric device when a predetermined condition is met.

According to another embodiment, an aircraft including any of the heat exchanger systems or heat exchange methods contained herein is disclosed.

According to yet another embodiment, a method of cooling a Full Authority Digital Engine Control (FADEC) of an aircraft is disclosed. The method includes: pumping fuel from a fuel tank via an input line to the FADEC through a low temperature side of a thermoelectric device; pumping the fuel from the FADEC via an output line through a high temperature side of the thermoelectric device back to the fuel tank; applying an electrical signal to the thermoelectric device to cause heat from fluid in the input line to be transferred to fluid in output line.

Additional features and advantages are realized through the techniques of the present disclosure. Other embodiments and aspects of the disclosure are described in detail herein.

For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Embodiments described herein to closed loop cooling system for a FADEC. The FADEC may be part of an aircraft and, as such, embodiments disclosed herein may be implanted on an aircraft. The system may utilize thermoelectric (TE) device positioned between the inbound and outbound fuel lines providing cooling fuel to the FADEC. In one embodiment, the TE device is superlattice device. The TE cooler, when powered, "pumps" heat from the inbound fuel line and provides that heat to the hot, outbound fuel line. According to one embodiment, the TE device is sized to handle fuel temperatures up to 190° F. at flow rates currently used for FADEC cooling. Closed loop control is achieved when fuel temperature sensing is applied to the inbound flow. When temperatures exceed inbound limits, a controller adjusts power provided to the TE device to effect cooling of the fuel to keep inbound fuel temperatures at the desired level.

Figure 1:
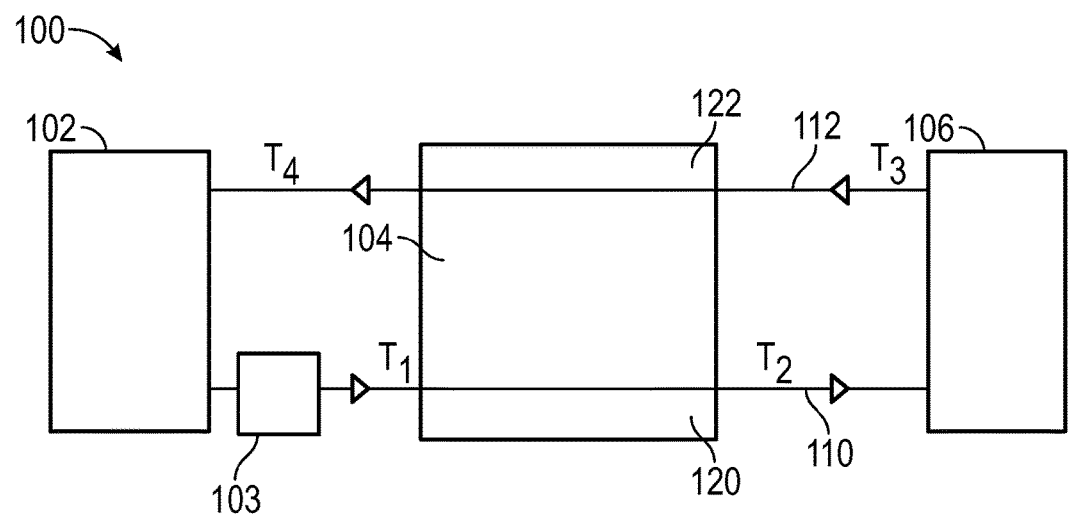
FIG. 1 shows a high level block diagram of heat exchange system where engine fuel is used as a cooling liquid to cool a FADEC.

FIG. 1 shows a high level block diagram of heat exchange system 100 where engine fuel is used as a cooling liquid to cool a FADEC. Most generally, the system includes a fuel tank 102, one or more pump (shown as pump 103), a TE device 104 and electronics to be cooled 106. In the following discussion the electronics may be referred to as a FADEC but is shall be understood that other electronics or even other non-electronic devices may be cooled in the manner disclosed herein. As such, while FADEC is used as a description, unless specifically required, the electronics to be cooled 106 are not limited to a FADEC.

Engine fuel is stored in a reservoir or fuel tank 102. The tank 102 may be a primary fuel tank used for all engines or an individual tank used for a single engine. Further, the tank 102 may be a portion of a larger tank. A pump 103 is provided that can pump fuel out of the tank 102. This pump 103 may be a single pump or may include more than one pump. Regardless of the configuration, the pump 103 causes fuel form the tank 102 to be provided through an input line 110 to the FADEC 106. The input line 110 passes through a low temperature heat source side 120 (referred to as "low temperature side" hereinafter) of the TE device 104 before being provided to the FADEC 106. The fuel in the input line 110 passes through, around or near the FADEC 106 such that heat from the FADEC 106 is transferred to the fuel. The fuel then returns to the fuel tank 102 via return line 112. Before returning the fuel tank 102 via return line 112, the fuel passes through the high temperature heat sink side 122 (referred to as "high temperature side") hereinafter of the TE device 104. In general, to the extent that the TE device removed heat from the fuel as it passed through the low temperature side 120, that heat is at least partially transferred to the fuel in the return line 112 as it passes through the high temperature heat sink side 122 of the TE device 104.

In operation, fuel enters the lower temperature side 120 of the TE device 104 at a first temperature $T_1$. When operating, the energy (heat) is removed from the fuel by the TE device 104 such that it leaves the TE device at a second, lower temperature $T_2$. The fuel then enters the FADEC 106 where it has heat transferred to it and leaves the FADEC at $T_3$. It is assumed that in operation, $T_3$ is greater than $T_2$.

As mentioned above, as the fuel in the return line 112 is passed through the high temperature side 122 of the TE device 104, heat removed from the fuel at the low temperature side 120 is added to the fuel such that it exits the TE device 104 at an even higher temperature $T_4$. That is, $T_4$ is greater than $T_3$ when the TE device is operating.

Figure 2:
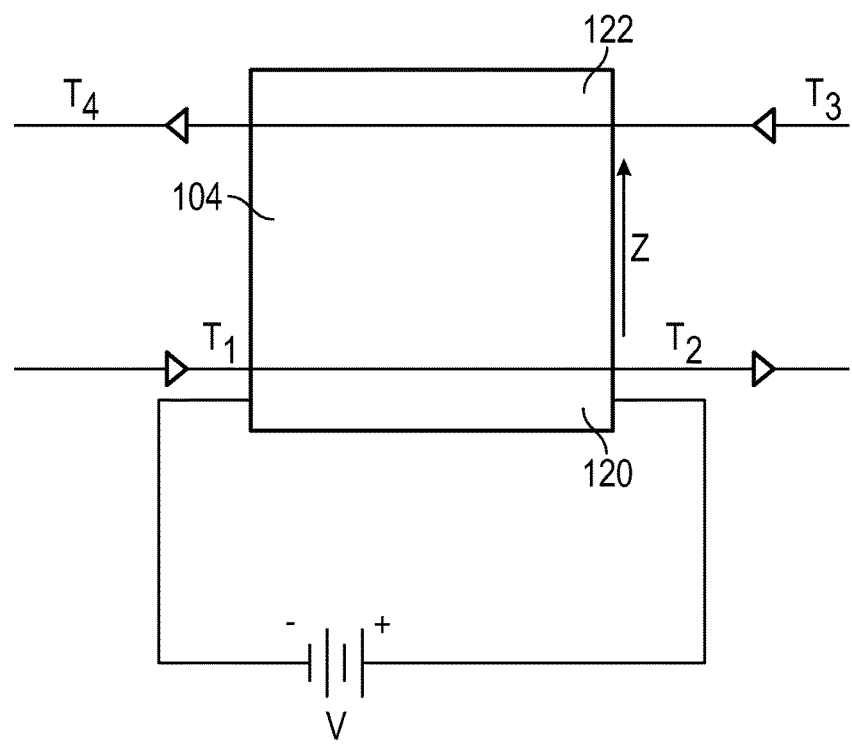
FIG. 2 shows a more detailed depiction of an example of a thermoelectric device that may be utilized in one embodiment.

In one embodiment, the TE device 104 may be formed such that that application of a voltage and current causes heat in one location to be moved to another location. With reference to FIG. 2, application of a voltage V and current to the low temperature side causes heat from to move from one side of the TE device to the other. The direction of the travel is based on the polarity of the voltage and the rate is based on the magnitude of the current. As shown, the direction of heat travel is against the temperature gradient.

Figure 3:
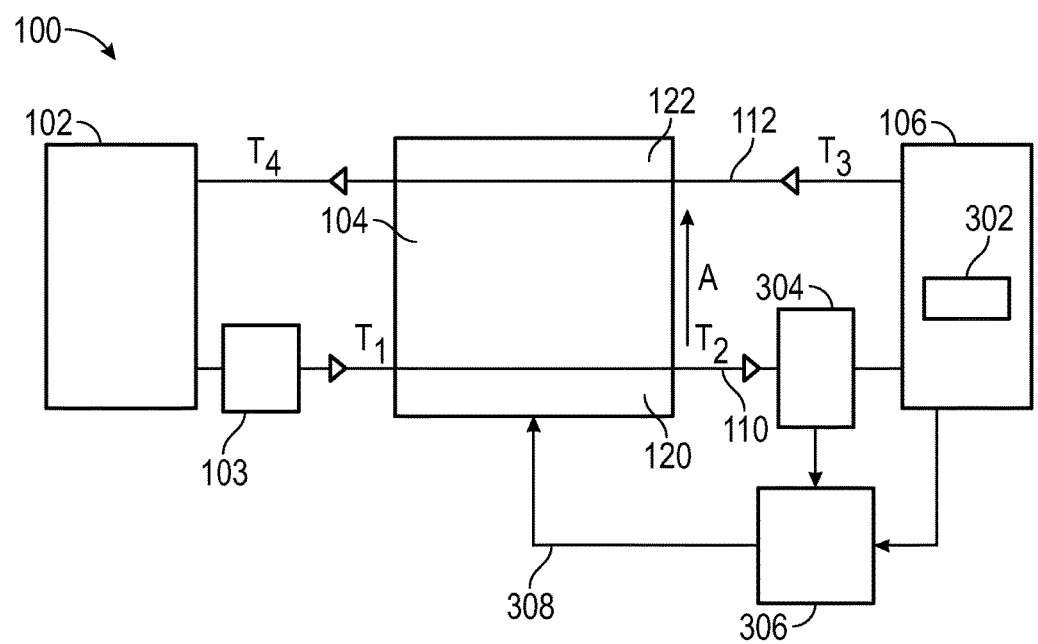
FIG. 3 shows a more detailed version of a system according to one embodiment.

As discussed above, and now with reference to FIG. 3, at times the TE device 104 may not be operating to remove heat from the input line 110. Such a case may exist when $T_1$ is sufficiently low to cool the FADEC 106 without having heat removed from it. To that end, in one embodiment, the system 100 may include a temperature sensor 304 that measures the temperature of the fuel in the input line 110 after it exits the TE device 104. Of course, the position of the sensor could be moved such that it is upstream (e.g., closer to the tank 102 than the TE device 104) of the TE device 104 in one embodiment.

In such a system a sensor 302 is also provided that measures the temperature in or near the FADEC 106. While shown in the FADEC itself, it shall be understood that the sensor need only be able to measure the temperature of the FADEC and does not have to necessarily be within it. Based on the two temperatures, a cooling controller 306 determines how much (if any) heat needs to be removed from the fuel such that $T_2$ is at a level that may effectively cool the FADEC 106. In one embodiment, the TE device 104 may operate when the temperature of the fluid leaving it is over a predetermined level. In another embodiment, the operation of the TE device 104 may depend on a difference in the temperature measured by sensor 302 and that measured by the temperature sensor 304. That is, the TE device may operate when a difference between a temperature of the fuel leaving the TE device 104 and a temperature of the FADEC 106 is below a limit difference.

Regardless, the amount of change needed will determine the voltage polarity and current level provided on line 308 to set the rate at which the TE device 104 removes heat from the input line 110. The exact manner in which voltage and current is applied will depend on the type/configuration of the TE device 104 used.

The above description provides for a system 100 that works in a closed loop manner to control the cooling of a FADEC 106. The "closed" refers to the means of controlling the temperature. For example, an open loop temperature control is one that sets temperature based on a table or some other condition that is fixed. As here, a closed loop system closes the control loop by measuring temperature and commanding a response (e.g., turning on the TE device).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A heat exchange system for an aircraft comprising:
   an aircraft controller for controlling an operation of an aircraft;
   a thermoelectric device having a low temperature side and a high temperature side;
   an inlet line that carries fuel from a fuel tank through the low temperature side of the thermoelectric device and to the aircraft controller; and
   an outlet line that carries the fuel away from the and aircraft controller through the high temperature side of the thermoelectric device;
   wherein heat is transferred away from the inlet line to the outlet line through the thermoelectric device when a predetermined condition is met, and the fuel is directly returned by the outlet line to the fuel tank at a temperature greater than a temperature of the fuel when it left the aircraft controller;
   wherein the predetermined condition is met when a temperature of the fuel leaving the thermoelectric device via the inlet line exceeds a predetermined temperature.

2. The heat exchange system of claim 1, further comprising:
   a control unit that provides an electrical signal to the thermoelectric device based on one or both of a temperature of fluid in the inlet line and a temperature of the aircraft controller.

3. The heat exchange system of claim 1, further comprising:
   a temperature sensor that measures a temperature of the fluid in the inlet line; and
   an aircraft controller temperature sensor that measures a temperature of the aircraft controller.

4. The heat exchange system of claim 3, further comprising:

a control unit that provides an electrical signal to the thermoelectric device based on one or both of the temperature of fluid in the inlet line and the temperature of the aircraft controller.

5. The heat exchange system of claim 1, further comprising:
the fuel tank from which the inlet line draws the fuel and into which the outlet line returns the fuel.

6. The heat exchange system of claim 5, further comprising:
a pump to circulate the fuel from the fuel tank to the aircraft controller and to return the fuel to the fuel tank.

7. The heat exchange system of claim 1, wherein the aircraft controller is a Full Authority Digital Engine Control.

8. An aircraft comprising:
a heat exchange system as recited in claim 1.

* * * * *